United States Patent [19]

Krivanek et al.

[11] Patent Number: 5,818,035
[45] Date of Patent: Oct. 6, 1998

[54] OPTICALLY COUPLED LARGE-FORMAT SOLID STATE IMAGING APPARATUS HAVING EDGES OF AN IMAGING DEVICE

[75] Inventors: Ondrej L. Krivanek, Orwell, England; Paul Edward Mooney, Pleasanton; Nils Timothy Swann, Lafayette, both of Calif.

[73] Assignee: Gatan, Inc., Pleasanton, Calif.

[21] Appl. No.: 714,763

[22] Filed: Sep. 16, 1996

Related U.S. Application Data

[63] Continuation-in-part of Ser. No. 527,172, Sep. 11, 1995.
[51] Int. Cl.⁶ .................................................. H01L 31/0203
[52] U.S. Cl. .................................... 250/208.1; 257/433
[58] Field of Search ........................... 250/227.31, 208.1, 250/239; 257/433, 434

[56] References Cited

U.S. PATENT DOCUMENTS

| | | |
|---|---|---|
| 4,890,159 | 12/1989 | Ogiu . |
| 5,065,029 | 11/1991 | Krivanek . |
| 5,098,630 | 3/1992 | Ogiu et al. . |
| 5,134,275 | 7/1992 | Aikens et al. . |
| 5,134,680 | 7/1992 | Schempp . |
| 5,142,557 | 8/1992 | Toker et al. . |
| 5,252,850 | 10/1993 | Schempp . |
| 5,302,818 | 4/1994 | Pezant . |
| 5,338,948 | 8/1994 | Sims . |
| 5,470,396 | 11/1995 | Mongon et al. . |

FOREIGN PATENT DOCUMENTS 55-159678  12/1989  Japan .

*Primary Examiner*—Edward P. Westin
*Assistant Examiner*—Kevin Pyo
*Attorney, Agent, or Firm*—Killworth, Gottman, Hagan & Schaeff, L.L.P.

[57] ABSTRACT

A large-format solid state imaging device which can detect optical images without loss of sharpness or resolution is provided and includes a solid state imaging device supported by and secured to a frame. To ensure that the imaging device does not deviate from its desired surface configuration, the device is pressed between an optical coupling plate and a support plate each having at least one matching surface whose curvature matches the other with a precision which permits the solid state imaging device to detect optical images without loss of sharpness or resolution and which conforms the imaging device into a desired configuration. Preferably, the frame is annular and the edges of the imaging device are secured to the frame by at least two spaced bonds.

9 Claims, 5 Drawing Sheets

OPTICALLY COUPLED LARGE-FORMAT SOLID STATE IMAGING APPARATUS HAVING EDGES OF AN IMAGING DEVICE

CROSS-REFERENCE TO RELATED APPLICATIONS

This application is a continuation-in-part of U.S. patent application Ser. No. 08/527,172 filed Sep. 11, 1995, and entitled OPTICALLY COUPLED LARGE-FORMAT SOLID STATE IMAGING DEVICE, the disclosure of which is hereby incorporated by reference.

BACKGROUND OF THE INVENTION

The present invention relates in general to the detection of light images by a solid state imaging device and, more particularly, to the detection of electron images from an electron microscope by converting them into light images and detecting them with a large-format solid state imaging device.

Transmission electron microscopes use a beam of accelerated electrons which pass through a sample to provide an electron image and/or diffraction pattern of the sample. To provide a record of these images and/or diffraction patterns, the electrons have been converted into light images using scintillator materials (e.g., phosphors), and the light images and/or patterns have then been captured by a camera. While photographic film has long been used, solid state imaging devices such as charge-coupled devices (CCD) of the type originally developed for astronomy to read light images into a computer have found increasing use in this field.

Such CCD cameras offer excellent resolution, sensitivity, linearity, up to 4,096×4,096 or more pixels, are reusable, and make the image available for viewing within seconds of detection and recording. However, the final resolution of any camera recording these images and patterns is determined, in part, by the resolution of the transfer optics from the scintillator to camera. Both fiber optics and lens optics have been used as transfer optics.

Current charge-coupled devices can have a large area, up to 5 cm×5 cm and larger. When a light image is projected onto such a large-area or large-format device, problems arise if the surface of the charge-coupled imaging device deviates from absolute flatness by more than about 10 μm.

Where fiber optics are used as the transfer optic, the image is typically projected onto a fiber optic plate. To ensure good 10 image resolution, the bottom face of each fiber in the plate needs to be in close contact with the surface of the charge-coupled device. Any gaps between the charge-coupled device and the fiber optic plate that are on the order of a single pixel (typically 5–24 μm) or larger, result in degraded image resolution because light bundles channeled by individual fibers spread in diameter when traversing these gaps. Additionally, if the contact area between the fiber optics plate and charge-coupled device is small in comparison to the overall size of the charge-coupled device, then high local pressures may be generated which may damage the charge-coupled device.

While manufacturing techniques for solid state imaging devices, such as charge-coupled devices, permit the manufacture of large-format devices, such devices tend to depart from absolute flatness by from 25–50 μm for sizes of 2.5 cm×2.5 cm and from 100–250 μm for sizes of 5 cm×5 cm. Positioning such imaging devices adjacent to flat fiber optics plates invariably leads to problems with gaps and potential damage to the devices.

If, on the other hand, light images are projected onto the solid state imaging device using lens optics, such images attain maximum sharpness only on an image plane or on a surface which deviates only very slightly from a plane. If the optical image is incident on a curved or bowed imaging device, loss of sharpness occurs wherever the actual surface of the charge-coupled device deviates from the image plane.

Attempts have been made in the art to address these problems. For example, Schempp, U.S. Pat. No. 5,134,680, teaches matching the shape of a solid state imaging device to a fiber optic plate by grinding the exact corresponding surface shape of the device into the fiber optic plate. However, such an operation is laborious and expensive as the surface shape which typically needs to be ground is not of a simple geometry. Further, as charge-coupled devices are typically operated at temperatures of about −25° to about −40° C. to minimize "dark current" problems, once the devices have been cooled, differential thermal expansion is likely to cause the devices to change their shape, creating the same gap problems as before even though the surfaces of the devices and the fiber optic plates were matched at room temperature.

More recently, Schempp, U.S. Pat. No. 5,252,850, teaches the use of a vacuum chuck which applies a vacuum through a specially drilled substrate to conform a charge-coupled device to the surface of the substrate. Adhesive is also spread over the surface between the charge-coupled device and the substrate which is said to secure the device in place. However, again, the process is laborious and expensive as a specially drilled substrate must be made whose passages align with the passages in the vacuum chuck. Further, the adhesive must be spread substantially uniformly to insure that the adhesive itself will not alter the desired surface configuration of the device.

Accordingly, the need still exists in this art for large-format solid state imaging which can detect projected optical images without loss of sharpness or resolution.

SUMMARY OF THE INVENTION

The present invention meets that need by providing a large-format solid state imaging apparatus and methods for making such apparatus which can detect optical images without loss of sharpness or resolution. In accordance with one aspect of the invention, an optically coupled solid state imaging apparatus is provided and includes a solid state imaging device supported by a frame. The solid state imaging device includes an image sensing area located generally inwardly from the edges of the device and preferably formed on a semiconductor wafer, with the edges of the device being supported by and secured to the frame. The entire peripheral edge of the device may be secured to the frame, the peripheral edge may be secured to the frame by at least two spaced bonds or the device may be temporarily secured relative to the frame by vacuum, spring clamps or mechanical structures. The frame may be annular or it may extend beneath and support the image sensing area of the solid state imaging device. However, in an embodiment where the support frame extends beneath the image sensing area, the frame must be flexible and capable of conforming to an adjacent surface.

The apparatus also includes an optical coupling plate and a support plate each having at least one surface which matches the curvature of the other. That is, the optical coupling plate and support plate have mating surfaces with matching curvatures such that their shapes match within a precision which will permit the solid state imaging device to detect optical images without loss of sharpness or resolution. Generally, this precision will be on the order of about 5 μm or less. In a preferred embodiment of the invention, the optical coupling plate and support plate have matching flat surfaces which deviate from absolute flatness by an amount which will permit the solid state imaging device to detect optical images without loss of sharpness or resolution. Again, this deviation from absolute flatness should be less than about 5 μm. Other useful embodiments for lens optical systems whose focal plane may not always be flat, but may have a simple radius of curvature, include an optical coupling plate and support plate having matching curved surfaces.

At least the image sensing area of the solid state imaging device is positioned between the respective surfaces of the optical coupling plate and the support plate. The optical coupling plate and the support plate are secured together such that the solid state imaging device is pressed against and conforms to the matching surfaces of the optical coupling plate and the support plate. Where the support frame extends beneath the solid state imaging device, it will also be pressed against and conform to the surface of the support plate.

For example, in the embodiment of the invention where the matching surfaces are flat, the optical coupling plate and support plate may be clamped together under a pressure sufficient to cause the solid state imaging device to be flattened or otherwise caused to conform to the matching surfaces of the coupling and support plates. The optical coupling plate and the support plate are bonded, with the application of pressure, to opposing sides of the imaging device using a suitable adhesive. Further, to protect the solid state imaging device from the environment, optionally, the solid state imaging device may be hermetically sealed between the respective surfaces of the optical coupling plate and the support plate.

In one embodiment of the invention, the optical coupling plate comprises a fiber optic plate. Alternatively, the optical coupling plate may be a uniform, transparent flat glass plate so that images from a lens optic can be transmitted to the solid state imaging device with good efficiency. To protect against distortions caused by temperature changes, the optical coupling plate and the support plate may be fabricated from materials having the same or very similar thermal expansion properties so that their coefficients of thermal expansion are matched.

If spaced bonds are used, any reasonable number of bonds may be provided to secure the edges of the device to the frame; however, it is preferred to provide a minimum amount of bonding necessary to ensure that the device remains secured to the frame during shipping and handling of the device. The imaging device may also be supported with no bonding providing the device is temporarily held in location relative to the frame for example by mechanical locating apparatus, vacuum, spring clamps and the like.

Accordingly, it is a feature of the present invention to provide a large-format solid state imaging apparatus which can detect optical images without loss of sharpness or resolution and a method for making the apparatus. This, and other features and advantages of the present invention, will become apparent from the following detailed description, the accompanying drawings, and the appended claims.

DESCRIPTION OF THE PREFERRED EMBODIMENTS

Figure 1:
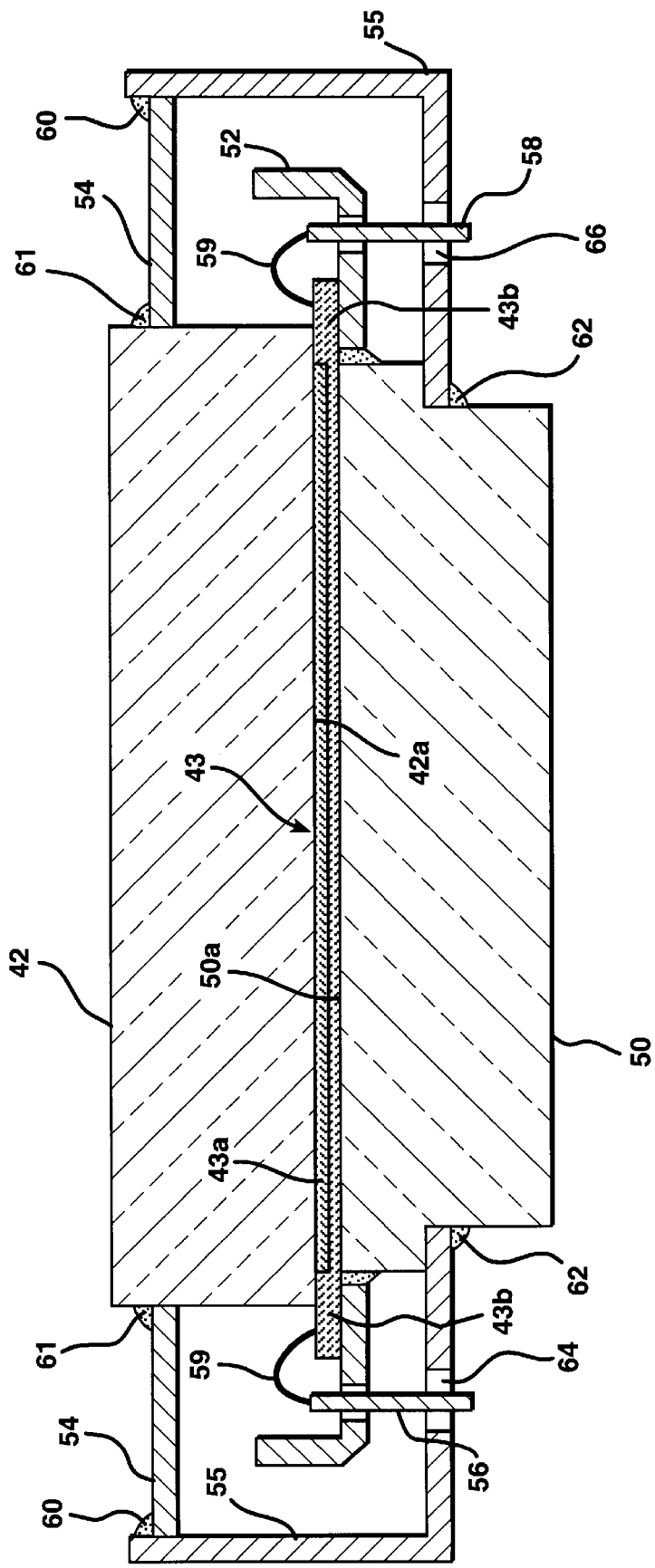
FIG. 1 is an enlarged cross-sectional view of the optically coupled solid state imaging apparatus of the present invention where the matching surfaces of the optical coupling plate and support plates are flat.

Referring to FIG. 1, a large-format, solid state imaging device 43 is shown having an image sensing area 43*a* formed on a semiconductor wafer 43*b*. An annular frame 52 contacts and supports the underside of the imaging device 43 about its peripheral edges. Alternatively, frame 52 may extend completely beneath the imaging device 43. An optical coupling plate 42 and a support plate 50 define matching surfaces 42*a*, 50*a* which are flat and deviate from absolute flatness by an amount which permits the solid state imaging device 43 to detect optical images without loss of sharpness or resolution. Preferably, the deviation from absolute flatness of the matching surfaces 42*a*, 50*a* is less than about 5 μm.

Figure 2:
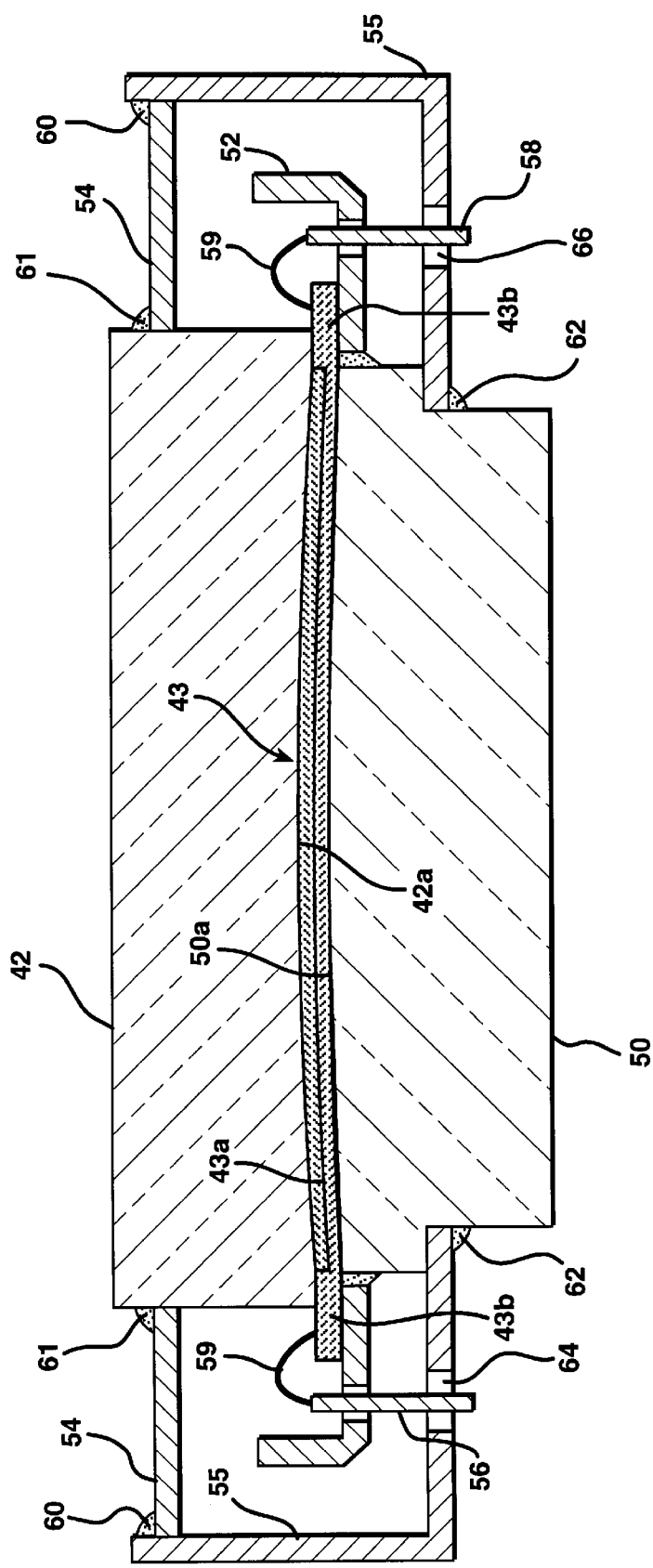
FIG. 2 is an enlarged cross-sectional view of another embodiment of the optically coupled solid state imaging apparatus of the present invention where the matching surfaces of the optical coupling plate and support plates have a simple radius of curvature.

As shown in FIGS. 1 and 2, the annular frame 52 is sealed to the imaging device 43 and provides support during the connection of electrical contacts 56, 58 to the imaging device 43 via bonding wires 59. The imaging device 43 is sandwiched between the optical coupling plate 42 and the support plate 50. The respective matching surfaces 42*a*, 50*a* of plates 42 and 50 which contact the imaging device 43 are polished so that they match with a precision of preferably about 5 μm. As shown, at least the image sensing area 43*a* of the solid state imaging device 43 is positioned between the respective matching surfaces 42*a*, 50*a* of the optical coupling plate 42 and the support plate 50 and conforms to the curvature of those matching surfaces.

A cover 54 and an outer body 55 are attached to the combination of the imaging device 43, the optical coupling plate 42 and the support plate 50. The cover 54 and the outer body 55 are held together by adhesive at a joint 60, and are held to the optical coupling plate 42 and the support plate 50 by adhesive at joints 61, and 62, respectively. Forces transmitted through the outer body 55 and the cover 54 during assembly ensure that the solid state imaging device 43 is pressed against the matching 42*a*, 50*a* of the optical coupling plate 42 and the support plate 50.

A preferred means for conforming the imaging device 43 to the desired shape includes temporary clamps (not shown) which apply a pressure of less than about 10 psi (0.7 kg/cm$^2$), and preferably about 0.5 to 3.0 psi (0.035 to 0.21 kg/cm$^2$) over the matching surfaces 42a, 50a of the optical coupling plate 42 and the support plate 50 during the application of adhesive to the joints 60, 61, and 62 at the junctions between the outer body 55 and the cover 54, the cover 54 and the coupling plate 42, and the outer body 55 and the support plate 50.

Such clamps may take the form of a number of conventional constructions. Those skilled in the art will appreciate that the exact construction of the clamping devices is not critical to the practice of this invention. In the alternative embodiment where the support frame extends beneath solid state imaging device 43, that portion of the frame will also be pressed to conform to the support plate 50. The outer body 55 includes holes 64, 66 for the electrical contacts 56, 58 to pass through.

In one embodiment of the invention, the optical coupling plate 42 comprises a fiber optic plate. Alternatively, the optical coupling plate 42 may be a uniform, transparent glass plate so that images from a lens optic (not shown) can be transmitted to the solid state imaging device 43 with good efficiency. To ensure against distortions caused by temperature changes, the optical coupling plate 42 and the support plate 50 may be fabricated from materials having the same or very similar thermal expansion properties so that their coefficients of thermal expansion are substantially matched. The large-format solid state imaging apparatus of the present invention is suitable for detecting electron images and/or diffraction patterns and converting them into light images and/or diffraction patterns which can be viewed and/or recorded. The invention is also applicable to detect electron spectra and other images and patterns formed by energetic radiation.

In the embodiment of the invention shown in FIG. 2, wherein like elements are represented by like reference numerals, the coupling plate 42 is made of transparent glass and the matching surfaces 42a, 50a of the coupling plate 42 and the support plate 50 are curved. Simple or even complex curvatures are possible for the present invention to conform the image sensing area 43a of the solid state imaging device 43 for use in lens optical systems whose focal plane is not flat.

In both of the embodiments illustrated in FIGS. 1 and 2, the optical coupling plate 42 and the support plate 50 are bonded, with the application of pressure, to opposing sides of the imaging device 43 using a suitable adhesive which will bond glass and ceramic materials together. To protect the solid state imaging device 43 from the environment, optionally, the imaging device 43 may be hermetically sealed between the respective surfaces of the optical coupling plate 42 and the support plate 50 by hermetically sealing the edges of the outer body 55 and the cover 54 to respective edges of the plates 42, 50 and sealing the cover 54 to the outer body 55 around the peripheral edges of the plates 42, 50, and further sealing the holes 64, 66 in the outer body 55 where electrical contacts 56, 58 pass through.

Figure 3:
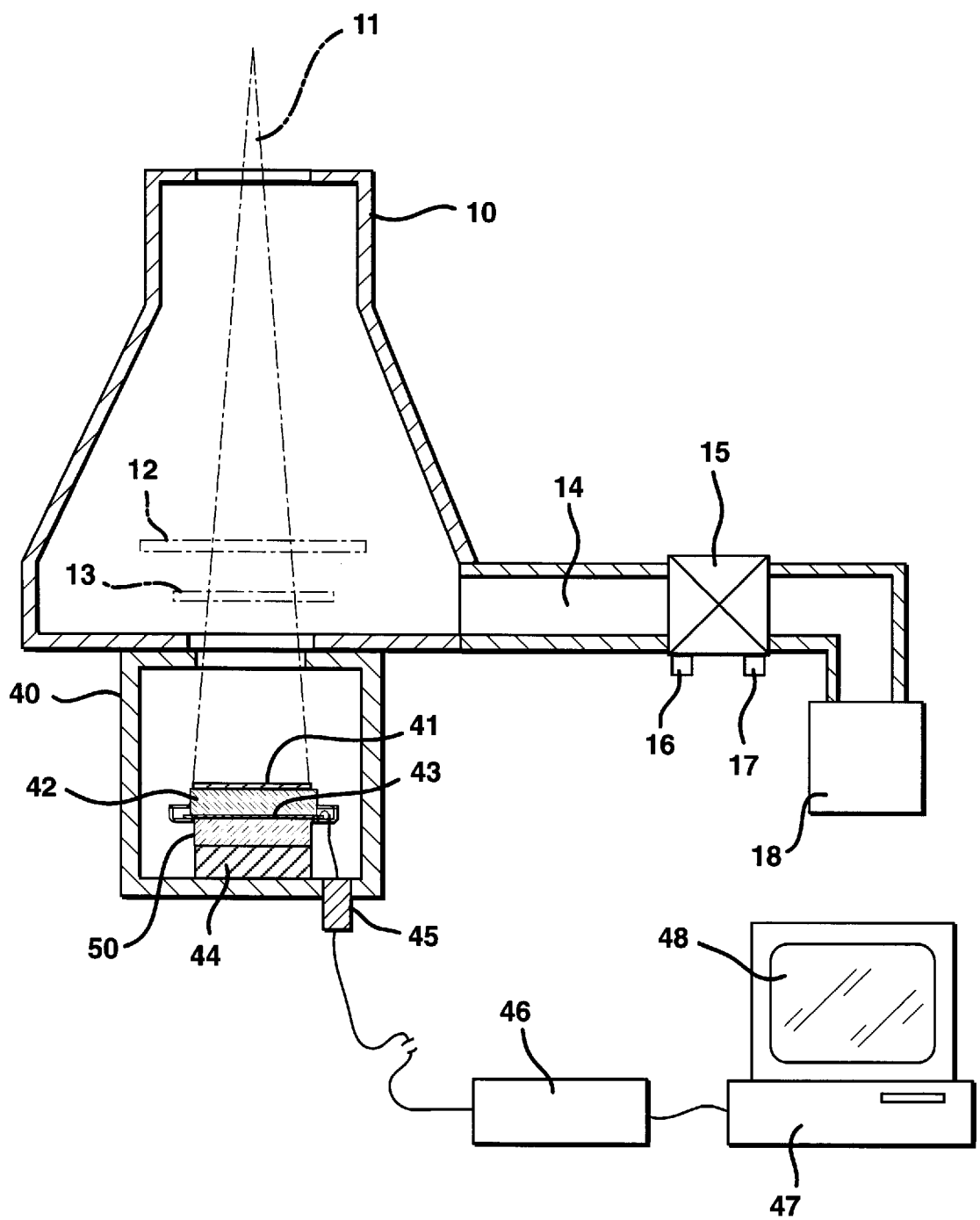
FIG. 3 is a schematic cross-sectional view of the optically coupled solid state imaging apparatus of the present invention attached to the projection chamber of a transmission electron microscope.

Referring now to FIG. 3, a schematic view of a typical use of the present invention is shown in which a charge-coupled device (CCD) camera 40 is mounted on the projection chamber 10 of a transmission electron microscope (TEM). As will be appreciated, such a charge-coupled device may also find use in a scanning electron microscope (SEM), or a scanning, transmission electron microscope (STEM) as well. Typically, the projection chamber 10 is attached to the end of an optical column of a TEM and houses a viewing screen 12 which is either lowered into an observation position or raised into a position in which it does not intercept an electron beam 11 which is projected into the chamber 10. The projection chamber 10 may also house a film magazine comprising a transport mechanism (not shown) which inserts a sheet of photographic film 13 into an exposure position and returns the sheet into the magazine after exposure.

The typical projection chamber further has several ports suitable for attaching a camera, one of which is usually situated at the bottom of the chamber. The chamber is normally evacuated via a vacuum pipe 14 leading to a gate valve 15 which can either open or close the chamber to a high vacuum (e.g., 10$^{-6}$ torr) pump 18. The gate valve in most modern TEMs is controlled pneumatically via two inlets 16 and 17 such that introduction of pressurized air into one inlet causes the valve to open, and the introduction of pressurized air into the other inlet causes the valve to close.

The electron beam 11 forming an electron image or diffraction pattern from a specimen in the microscope traverses the chamber 10. The CCD camera 40 comprises a scintillator 41 which converts the electron image into a light image and the large-format, solid state imaging device 43 sandwiched between the optical coupling plate 42 and the support plate 50. Charge coupled devices which can be used as the imaging device 43 are commercially available from several manufacturers including Kodak, Ford, Scientific Imaging Technologies (SITe), Hamamatsu, Thomson CSF, and English Electric Valve Ltd. Preferred large-format solid state imaging devices are scientific grade CCDs whose imaging areas comprise 1024×1024 or more pixels that are 19 $\mu$m×19 $\mu$m in size or larger.

The CCD must be operated cold to keep its dark current small enough so that the noise in the dark current accumulated during a typical exposure does not limit the performance of the camera. The typical exposure in an electron microscope is from about 1 to 20 seconds. Maintaining the CCD at a temperature of about $-25°$ to about $-40°$ C. is typically sufficiently low for the accumulated dark current to be acceptably small at exposure times of up to about 1 minute. Such a temperature is conventionally achieved using a thermoelectric cooling device, schematically shown as device 44, whose cold side may be in contact with the support plate 50.

The imaging device 43 is connected to an external electronics unit 46 through a vacuum feed-through 45 which transfers captured images to a digital computer 47 for storage in memory, processing, display or the like. The images may be displayed on a view screen 48, such as a CRT, attached to the computer 47. For the present invention, the images may be digitized with a 14 bit dynamic range at 450 kHz and then displayed by a Power Macintosh computer using Digital/Micrograph software commercially available from Gatan, Inc., Pleasanton, Calif. Other details of operation are set forth in commonly-owned U.S. Pat. No. 5,065,029, the disclosure of which is incorporated by reference.

As noted, the annular frame 52 can be filled in such that it extends beneath the solid state imaging device 43 and is also pressed to conform to the support plate 50. For such a filled frame and with the imaging device 43 bonded to the filled frame around its entire periphery, the forces required to conform the imaging device 43 may be sufficient to damage the imaging device 43. Such forces can be reduced by a progressive bonding of the imaging device 43 to the frame 52 with the use of a cold flow bonding agent or adhesive. The forces are reduced and more rapid bonding can be accomplished with the annular frame 52 and accordingly, it is preferred.

The image device conforming forces can be further reduced by reducing the bonding of the imaging device 143 to the frame 52 to less than the entire periphery of the imaging device 143. Such reduced bonding is accomplished by bonding the imaging device 43 to the frame 52 by bonds at spaced positions around the frame 52, for example, by at least two spaced bonds. Spaced bonding, which securely holds the imaging device 43 to the frame 52 but does not appreciably add to its stiffness, will be described further with reference to FIGS. 4 and 5 wherein like elements are represented by like reference numerals.

Figure 4:
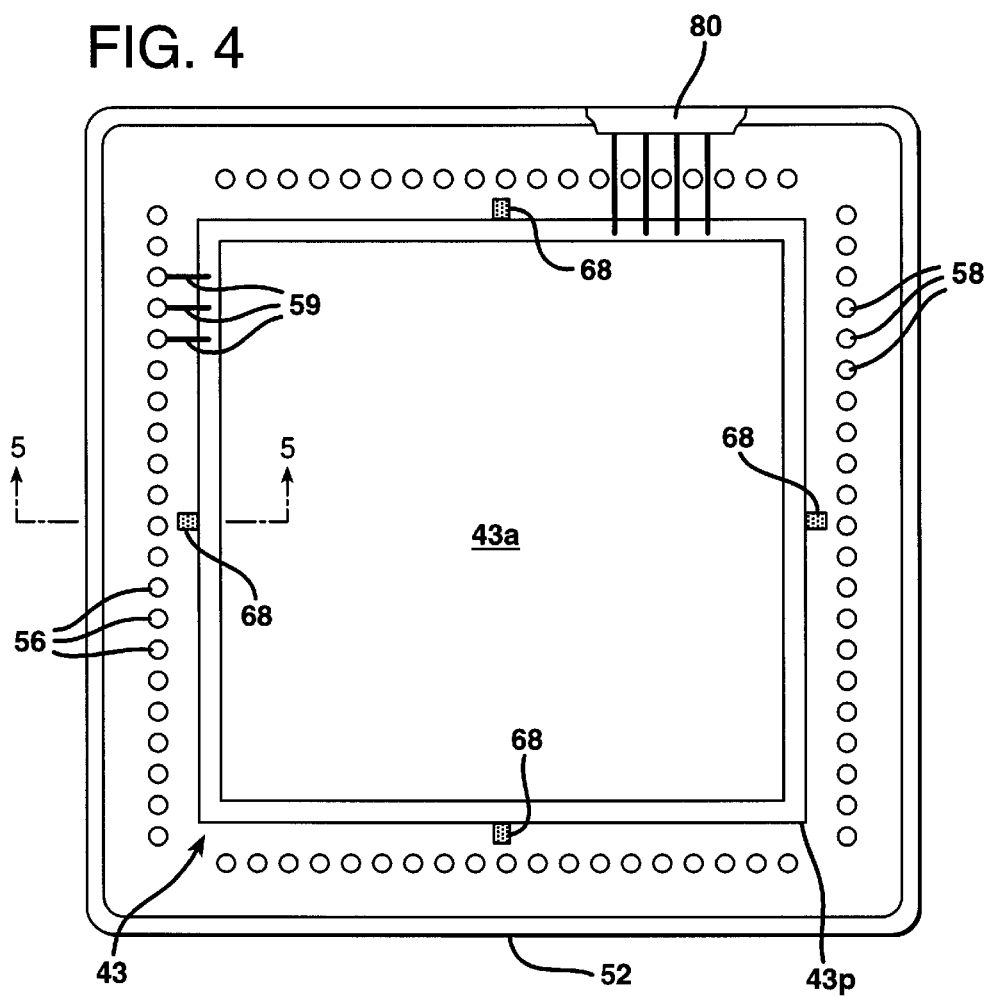
FIG. 4 is a plan view of an imaging device for use in the optically coupled solid state imaging apparatus of the present invention.
Figure 5:
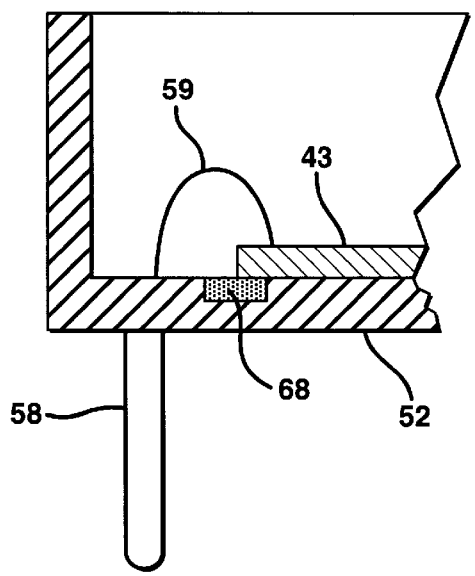
FIG. 5 is an enlarged cross-sectional view of a portion of the imaging device of FIG. 4 taken along the section line 5—5 and illustrating the spaced point bonds for securing an imaging device to a support frame.

Typically, the imaging device 43 and the frame 52 are generally rectangular with the illustrated embodiment of FIG. 4 substantially square. Spaced bonds 68 are located around the periphery 43p of the imaging device 43 with at least two spaced bonds 68 being positioned on opposite sides of the imaging device 43. The spaced bonds 68 are illustrated as relatively small bonds often referred to as point bonds; however, a large variety of bond sizes are contemplated for use in the present invention. The spaced bonds 68 can be thermoplastic glue, elemental indium or other appropriate bonding materials as will be known to those skilled in the art.

A bonding pattern is selected to provide a reduced and preferably a minimum amount of bonding necessary to ensure that the imaging device 43 remains secured to the frame 52 during shipping and handling of the imaging device 43. To that end, it is believed that at least one bond 68 on each side of the imaging device 43 is sufficient and it is currently preferred to have one bond 68 on each side of the imaging device 43 with the bonds 68 being generally centered along each side of the imaging device 43. Of course, other bonding patterns are possible in accordance with the invention. Such minimum bonding maintains the position of the imaging device 43 relative to the frame 52 yet permits the imaging device 43 to be conformed to the matching faces 42a, 50a with reduced force.

The image device conforming forces can be still further reduced by eliminating the bonding of the imaging device altogether as will be described with reference to FIG. 6 wherein like elements are represented by like reference numerals. While for these embodiments the imaging device 43 is not bonded, it is supported or secured relative to the frame 52 in a variety of ways with three different arrangements being illustrated in FIG. 6. It is noted that typically only one supporting or securing arrangement is used; however, all three are illustrated in FIG. 6 for ease of illustration.

As illustrated, the frame 52 is bonded to the support plate 50 by adhesive joints 70. For the first arrangement, the support plate 50 comprises elements 72, which can be spaced tabs, ears, continuous shoulders or the like, which mechanically support and locate the solid state imaging device 143 relative to the support plate 50 and hence the frame 52 secured thereto. The bonding wires 59 can then be connected to the imaging device 43, with the support plate 50 providing the necessary support for the wire bonding, and the imaging apparatus is then assembled as described above.

In a second arrangement, a passage 74 is formed through the support plate 50 and a fitting 76 is temporarily connected to the support plate 50 for example by temporary adhesive joints 78. A vacuum pump (not shown) is then connected to the fitting 76 to pull a vacuum in the passage 74 to thereby secure the imaging device 43 to the support plate 50 for the wire bonding and assembly of the imaging apparatus as described above.

Figure 6:
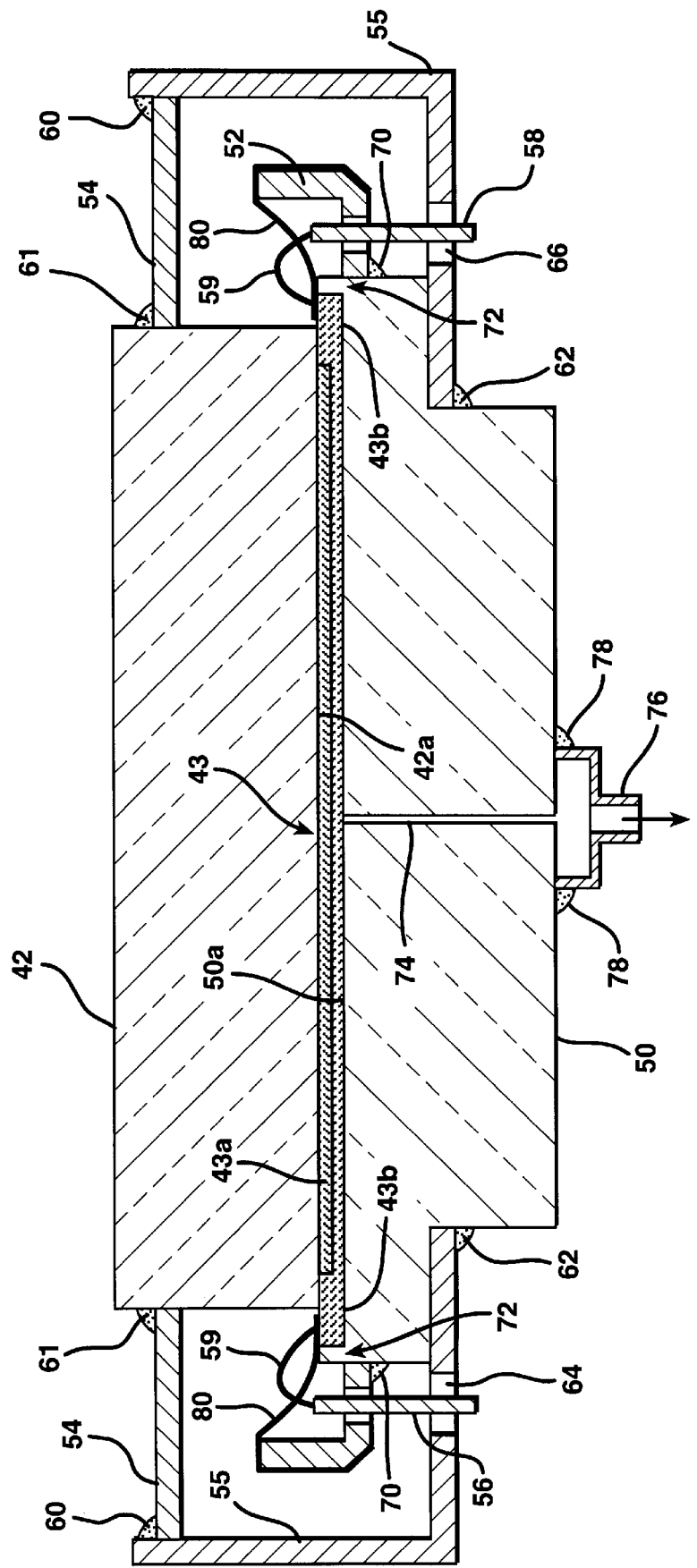
FIG. 6 is an enlarged cross-sectional view of still another embodiment of the optically coupled solid state imaging apparatus of the present invention where the imaging device is not bonded.

Spring clamps 80 shown in FIGS. 4 and 6 are utilized in a third arrangement for securing the solid state imaging device 43 relative to the frame 52. The spring clamps 80 include thin elements which resemble the teeth in a comb which extend between the contacts 56, 58 to engage the peripheral edges of the solid state imaging device 43. The spring clamps 80 thus temporarily hold the imaging device 43 in place during bonding of the bonding wires 59 to the imaging device 43. The spring clamps 80 are then removed during final assembly of the imaging apparatus as described above. The spring clamps 80 can be of any reasonable size and number necessary to adequately hold the imaging device 43 with the spring clamps 80 being applied to two or more sides of the imaging device 43 as required.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. An optically coupled solid state imaging apparatus comprising:

a solid state imaging device including peripheral edges and an image sensing area, said peripheral edges of said imaging device being supported by an annular frame and secured to said frame only by at least two spaced bonds which securely hold said solid state imaging device to said annular frame but do not appreciably add to stiffness of said solid state imaging device; and an optical coupling plate and a support plate each having at least one matching surface whose curvature matches the other with a precision which permits the solid state imaging device to detect optical images without loss of sharpness or resolution;

at least said image sensing area of said solid state imaging device being pressed against and conforming to the respective matching surfaces of said optical coupling plate and said support plate by conforming forces, wherein the level of said conforming forces needed to conform said solid state imaging device to said respective matching surfaces is not appreciably affected by said spaced bonds since said spaced bonds do not appreciably add to the stiffness of said solid state imaging device.

2. An optically coupled solid state imaging apparatus as claimed in claim 1 wherein said imaging device is generally rectangular and said at least two spaced bonds are on opposite sides of said imaging device.

3. An optically coupled solid state imaging apparatus as claimed in claim 1 wherein said imaging device is generally rectangular and said at least two spaced bonds comprise at least one bond on each side of said imaging device.

4. An optically coupled solid state imaging apparatus as claimed in claim 3 wherein said at least one bond on each side of said imaging device comprises one bond on each side of said imaging device which is generally centered along each side of said imaging device.

5. An optically coupled solid state imaging apparatus comprising:

a solid state imaging device including edges and an image sensing area, said edges of said imaging device being supported by a frame and secured to said frame by at least two spaced bonds; and an optical coupling plate and a support plate each having at least one matching surface whose curvature matches the other with a precision which permits the solid state imaging device to detect optical images without loss of sharpness or resolution;

at least said image sensing area of said solid state imaging device being pressed against and conforming to the respective matching surfaces of said optical coupling plate and said support plate, and wherein said optical coupling plate and said support plate are fabricated from materials having the same or very similar thermal expansion properties.

6. A method for making an optically coupled solid state imaging apparatus comprising the steps of:

providing an annular frame;

securing a solid state imaging device including peripheral edges and an image sensing area within said frame by said peripheral edges of said imaging device by only at least two spaced bonds so that said spaced bonds do not add appreciably to stiffness of said solid state imaging device; and pressing at least said image sensing area of said solid state imaging device into conformance with respective matching surfaces of an optical coupling plate and a support plate by applying imaging device conforming forces, said respective matching surfaces of said optical coupling plate and said support plate having curvatures which match one another with a precision which permits said imaging device to detect optical images without loss of sharpness or resolution wherein the level of said conforming forces needed to conform said solid state imaging device to said respective matching surfaces is not appreciably affected by said spaced bonds since said spaced bonds do not appreciably add to the stiffness of said solid state imaging device.

7. A method for making an optically coupled solid state imaging apparatus as claimed in claim 6 wherein said imaging device is generally rectangular and said step of securing said imaging device to said frame comprises the step of securing said imaging device to said frame by bonds on opposite sides of said imaging device.

8. A method for making an optically coupled solid state imaging apparatus as claimed in claim 15 wherein said imaging device is generally rectangular and said step of securing said imaging device to said frame comprises the step of securing said imaging device to said frame by at least one bond on each side of said imaging device.

9. A method for making an optically coupled solid state imaging apparatus as claimed in claim 8 wherein said step of securing said imaging device to said frame by at least one bond on each side of said imaging device comprises the steps of:

securing said imaging device to said frame by one bond on each side of said imaging device; and generally centering each bond along each side of said imaging device.

* * * * *

UNITED STATES PATENT AND TRADEMARK OFFICE
CERTIFICATE OF CORRECTION

PATENT NO. : 5,818,035

DATED : October 6, 1998

INVENTOR(S) : Ondrej L. Krivanek et al.

It is certified that error appears in the above-identified patent and that said Letters Patent is hereby corrected as shown below:

On the title page, item

[54] "OPTICALLY COUPLED LARGE-FORMAT SOLID STATE IMAGING APPARATUS HAVING EDGES OF AN IMAGING DEVICE" should be --OPTICALLY COUPLED LARGE-FORMAT SOLID STATE IMAGING APPARATUS HAVING EDGES OF AN IMAGING DEVICE SECURED TO OR RELATIVE TO A SUPPORTING FRAME AND METHODS OF MAKING SAME--.

Col. 9, line 29, "resolution wherein" should read --resolution, wherein--.

Col. 10, line 13, "in claim 15" should read --in claim 6--.

Signed and Sealed this

Twenty-third Day of February, 1999

Attest:

Q. TODD DICKINSON

*Attesting Officer*

*Acting Commissioner of Patents and Trademarks*